United States Patent [19]

Poirot et al.

[11] Patent Number: 5,282,148
[45] Date of Patent: Jan. 25, 1994

[54] METHOD AND APPARATUS FOR THE DESIGN AND FABRICATION OF INTEGRATED CIRCUITS EMPLOYING LOGIC DECOMPOSITION ALGORITHMS FOR THE TIMING OPTIMIZATION OF MULTILEVEL LOGIC

[75] Inventors: Franck J. Poirot, Antipolis; Pierre G. Paulin, Grenoble, both of France

[73] Assignee: VLSI Technology, Inc., San Jose, Calif.

[21] Appl. No.: 356,023

[22] Filed: May 23, 1989

[51] Int. Cl.$^5$ .............................. G06F 15/60
[52] U.S. Cl. ........................ 364/491; 364/490; 364/489; 364/488
[58] Field of Search ............... 364/488, 489, 490, 491, 364/578

[56] References Cited

U.S. PATENT DOCUMENTS

| | | | |
|---|---|---|---|
| H354 | 10/1987 | Rubin | 364/491 |
| T940,008 | 11/1975 | Oden et al. | 364/490 |
| T944,001 | 3/1970 | Hanan et al. | 364/490 |
| 3,622,762 | 11/1971 | Dyer | 364/489 |
| 3,702,003 | 10/1972 | Ramirez, Jr. et al. | 364/489 |
| 4,924,430 | 5/1990 | Zasio et al. | 364/578 |
| 4,945,503 | 7/1990 | Takasaki | 364/578 |
| 4,954,953 | 9/1990 | Bush | 364/578 |

OTHER PUBLICATIONS

"MIS: A Multiple-Level Logic Optimization System" by R. K. Brayton et al., IEEE Trans. on Computer-Aided, vol. CAD-6, No. 6, Nov. 1987, pp. 1062-1081.

*Primary Examiner*—Vincent N. Trans
*Attorney, Agent, or Firm*—Bowles Horton

[57] ABSTRACT

A process of realizing large scale integrated circuits by means of a programmed data processor includes minimizing timing delays in the technology mapping phase by employing algorithms which are based on a linear model in terms of number of inputs and a load capacitance of a gating function and which permit a decomposition of the gating function into gates having m inputs and $[(n-m)+1]$ inputs wherein m is greater than two. Balanced decompositions may be allowed in appropriate conditions.

23 Claims, 4 Drawing Sheets

METHOD AND APPARATUS FOR THE DESIGN AND FABRICATION OF INTEGRATED CIRCUITS EMPLOYING LOGIC DECOMPOSITION ALGORITHMS FOR THE TIMING OPTIMIZATION OF MULTILEVEL LOGIC

BACKGROUND OF THE INVENTION

The present invention concerns the design and fabrication of large scale integrated circuits with the aid of a programmed data processor, hereinafter called compiler, by means of which an operator initially specifies a function and achieves a detailed instruction for the layout of a large scale integrated circuit which implements, in the selected technical realisation, the function which has been specified by the operator. The design, checking and testing of large scale integrated circuits is so complex that the use of such a programmed data processor is essential for any normal circuit or function. This is partly because the digital signal processing functions are inherently complicated, partly because the main data processing functions need to be decomposed into simpler functions which are within the library of the processor and partly because considerable computation is required in order to achieve an efficient layout of the network. It will be understood that the result of the computerised design process is a detailed specification defining, in terms of a particular technology, a complex integrated circuit. Such a specification may be regarded as a template for the fabrication of the physical embodiment of the integrated circuit.

Compilers of the kind set forth above are commercially available and have been described in the literature. Reference may be made for example to Rabaey et al.

"Cathedral - 2: Computer Aided Synthesis of Digital Signal Processing Systems", Proceedings of the IEEE CICC 1987 pages 157-160 (1987), S. G. Smith and R. W. Morgan "High Level DSPASIC Design Tool", Proceedings Euro—ASIC 1989 pages 117-129, Grenoble, France, January 1989; Hartley et al., "A Digit—Serial Silicon Compiler" Proceedings 25th ACM/IEEE DA Conference pages 646-649, California, June 1988; Proceedings of the 24th Design Automation Conference, Miami, Florida, June 1987; Proceedings of the International Workshop on Logic and Architectural Synthesis for Silicon Compilers, Grenoble, May 1988; Proceedings of the International Conference on Computer Aided Design, Santa Clara, California, November 1988; and IEEE Transactions on Computer Aided Design on Integrated Circuits and Systems, Volume CAD-5 Number 4, October 1986.

As an example of the complexity of the circuits which are realized with the aid of such processors, a sixteen bit discrete cosine transform circuit, comprising twenty five digital adders, twenty five digital subtractors and eleven digital rotators, requires for its full specification about seventy pages or more of schematic diagrams when expressed in detailed circuit form. It is not feasible to design circuits of such complexity by hand within any reasonable time. An added factor in the need to employ computer aided design is constituted by a multiplicity of other requirements, including the achieving of efficient utilization of area in the layout of the integrated circuit and particularly for digital signal processing, the optimization of throughput. One of many factors affecting throughput is the phenomenon of different arrival times of each of a multiplicity of signals at a multiple input gate, such as a NAND or AND gate.

SUMMARY OF THE STATE OF THE ART

One of the important stages in the synthesis of large scale integrated circuits is optimization under programmed control. This process is normally called netlist optimization. A process of logic synthesis may commence with the original functional statement of the circuit that is to synthesized and follow with the stages of mimimization, factorisation and mapping. The last mentioned stage is a synthesis in terms of the basic circuits or cells which are maintained for access in a cell library. Before this stage is implemented, the circuit which is to be synthesized is expressed in terms of logic (such as Boolean equations) in a manner which is independent of technology, that is to say it does not express the logic in terms of particular circuits which are dependent upon the choice of fabrication, such as CMOS (complementary metal-oxide semiconductors) technology. The mapping process converts the logical representation which is independent of technology into a form which is dependent upon technology and which has recourse to standard circuits, or cells, which are held within a cell library forming part of the data available to the data processor.

The mapping process is determined by algorithms which are generally based on three different strategies. These can be broadly characterised as minimization of area, minimization of total delay and minimization using an area-time objective function. As will be seen, the present invention is primarily concerned with the minimization of the total delay.

Although many techniques for technology mapping have been described, only a few of the most recent systems are concerned with the optimization of timing. Other systems, for example, the early versions of Dagon, are described by Keutzer et al., "DAGON: Technology Binding and Local Optimization by DAG Matching", Proceedings of the 24th Design Automation Conference, Miami, Florida, June 1987, Pages 341-347; and by Detjiens et al., "Technology Mapping in MIS", Proceedings of ICCAD, Santa Clara, California, November 1987, Pages 116-119. These systems are mostly concerned with the reduction of area, i.e. the area occupied by the final circuit layout.

For those systems which consider the optimization of timing, decomposition of AND gates and NAND gates is one of the important techniques which are exploited. This is particularly true in many systems which make use of an intermediate form of a NAND inverter to realize the logical equations. Such systems are described by Detjiens et al (see above); by Hachtel et al., "TECH-MAP: Technology Mapping with Delay and Area Optimization", Proceedings of the Intl. Workshop on Logic and Architecture Synthesis for Silicon Compilers, Grenoble, May 1988; and by Jit Sing et al., "Timing Optimization of Combinational Logic", Proceedings of ICCAD, Santa Clara, California, November 1988, Pages 282-285. This type of realization is particularly interesting in CMOS technology because it is generally faster than the corresponding realization in terms of NOR gates. Independently of the representation used, NAND and AND gates are often found on the critical path, which determines speed and throughput, while OR, NOR and more complex gates are used away from the critical path if this enables savings in area to be made. Accordingly, the latter types of gate are rarely appropriate for decomposition which aims to reduce total delay at the possible expense of increasing area.

In systems which perform optimization of timing it is known from Hatchtel et al. to provide a simple heuristic which relies on a recursive two-way NAND decomposition algorithm.

The approaches proposed by Jit Sing et al. and Keutzer et al. include a similar two-way decomposition of AND and NAND gates with most of the same limitations. In Jit Sing et al., the compromising of speed and area is considered when determining which transformation to apply. The system described by Bartlett et al. exploits heuristic rules in the final phase of optimization to move critical signals closer to the output while performing general logic decompositions.

Finally, Hoffman et al. in "Delay Optimization of Combinational Statics CMOS Logic" Proceedings of the 24th Design Automation Conference, Miami, Florida, June 1987, Pages 125–132, consider a similar decomposition problem for complex gates. They employ a simple heuristic to group signals when they are within some percentage of the critical signal. The threshold percentage value is fixed and is obtained through experimental observation.

SUMMARY OF THE INVENTION

The main object of the present invention is to provide an improved synthesis of multilevel logic and in particular to improve the technology mapping process by means of an improved decomposition technique.

The present invention provides, for incorporation into a computer aided process for the layout and/or fabrication of a large scale integrated circuit, novel fast decomposition algorithms that are derived from linear or piecewise linear models for gate delays. The algorithms perform locally optimal m-way balanced or unbalanced decomposition of logic gates to achieve a maximum timing gain. The decompositions can take the output load into account. One advantage of the present invention is that in general it provides a substantial speed improvement over known two-way decompositions without the penalty of a corresponding increase in the area occupied by the circuit which is synthesized. The invention is applicable to industrial standard cell and gate array libraries and may readily be integrated into commercially available technology-mapping processes.

In particular, the present invention provides, in a process of realizing with the aid of a programmed data processor a layout of a large scale integrated circuit including a multiplicity of gating means, a method of decomposing a gating function determined to have a plurality n of input signals, the method comprising determining the arrival times $t_i$ of the said input signals of the said gating function, wherein i has the values 1 to n inclusive; and computing a decomposition of the gating function with a cascade of gating means in accordance with a linear model of the gating function in terms of n and a load capacitance. The computation is in accordance with an algorithm which optimizes timing gain, in accordance with expressions which can be directly derived from said model. The decomposition will usually be an unbalanced decomposition though in some cases the decomposition algorithm may be modified to provide a balanced decomposition of the said gating function.

When the gating function is an AND function, the function may according to the invention be realized as two AND gates. The algorithm may be chosen to determine whether a further decomposition of one or more of such gates yields any additional reduction in time delay. When the gating function is a NAND function, it may according to the invention be realized as a NAND gate disposed to receive the first m of the input signals and a second NAND gate disposed to receive the remainder of the said input signals together with the output of the first NAND gate by way of an inverter. Usually, for speed and area criteria, a NAND gate driven by an inverter is substituted by an AND gate. Although the invention is applicable to OR functions and NOR functions, normally these are of lesser importance because they are transformed into their equivalent AND or NAND DeMorgan substitutions.

Other objects and advantages of the invention will become apparent from the following detailed description with reference to the drawings.

DETAILED DESCRIPTION OF PREFERRED IMPLEMENTATION

Introduction

Figure 1:
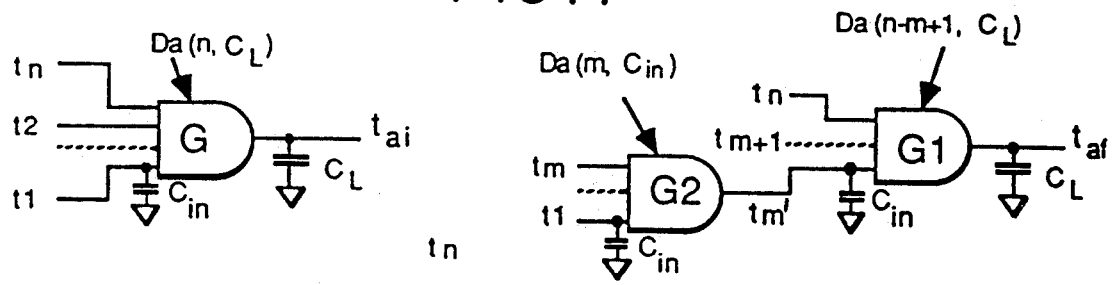
FIG. 1 illustrates the stages of an unbalanced AND decomposition.

It will be assumed in the following that the reader is familiar with the organization and operation of a compiler for the synthesization of large scale integrated circuits particularly those employed for digital signal processing. The prior art aforementioned gives a broad view of such processors.

It will also be presumed that the reader does not need instruction on the expression of the high-level algorithms described herein in the particular programming language employed in the compiler or synthesizer. As mentioned hitherto, the present invention is concerned with the stage of operation when the compiler is converting a representation of a complex electrical function which is to be synthesized into a form which is specific to the particular type of circuit fabrication and which will determine the layout and configuration of all the circuit elements. Part of this process comprises an examination, by the programmed compiler, of the operation of the function to determine, for each of a large multiplicity of gating functions (usually AND or NAND functions) the times of arrival of the various input signals. Such times of arrival are computed by considering the various signal paths to that gating device from the or each input and the delays in those paths.

As will become apparent, one means of achieving reduction in overall delay is to decompose a multiple input gate into a network of gates each with fewer inputs. In order to obtain an algorithm for this purpose it is necessary to postulate a 'model' of a multiple input gate. One aspect of the invention concerns the use of linear models to estimate worst case gate delays.

The models allow for an analytic formulation of the conditions for maximal delay reduction - which in turn leads to a simple algorithm for locally optimal m-way decompositions quickly and easily, an important asset for this type of problem which invariably involves large netlists. The models also provide quick time-area tradeoff measures to grade the applicable transformations. Since most interest centres on CMOS technology, the most important decompositions are AND and NAND decompositions, since these yield the highest speed for a given area. However, some models can be used for more than one kind of gate.

Linear Model for AND, and OR Gates

A model for such gates is postulated herein as a linear function of the number, of gate inputs, the load capacitance, and technology dependent constants. The latter can be derived by curve fitting using simple linear regression techniques. The resulting precision of the model lies somewhere between that of the unit delay model and the library element gate delay model described by Bartlett et al., and Jit Sing et al. respectively. A delay model suitable for AND gates defines the worst case rise or fall time. It is of the form:

$$D_a(n, C_L) = K_d + K_n \cdot n + K_c C_L \qquad (1)$$

wherein:
$D_a$ = rise or fall time
n = number of inputs
$C_L$ = load capacitance
$K_d$, $K_n$, $K_c$ = technology specific constants
It is also assumed that the input capacitance $C_i$ is similar for all n-input AND gates of a given technology.

The model is simple because the internal output capacitance is independent of the number of inputs. In both gate array and standard cell technologies, the area of the cell is nearly a linear function of the number of inputs:

$$A_{AND}(n) = K_{Ad} + K_{An} \cdot n$$

where A is the area and the K are constants.

This model was tested on four commercially available cell libraries, namely the VGT10 Portable 2-micron CMOS Gate Array Library Version 1.1.(1988), the VGT100 Portable 1.5-micron CMOS Gate Array Library Version 1.1(1988), the VSC10 Portable 2-micron CMOS Standard Cell Library Version 1.1(1988) and the VSC 100 Portable 1.5-micron CMOS Standard Cell Library, Version 1.1(1988) all available from VLSI Technology Inc. Correlation coefficients of better than 0.99 were obtained for AND and OR gates from the four Libraries.

Linear Model for NAND and NOR Gates

A model for NAND and NOR gates is a little more complex than that for an AND gate because the internal output capacitance is dependent on n, the number of inputs. The slew rate is also dependent on n since there is no inverter attached to the output. These considerations lead to the following model:

$$D_n(n, C_L) = K_d + K_n \cdot n + K_C \cdot C_L + K_{nc} \cdot n \cdot C_L \qquad (2)$$

The correlation coefficients for the technologies tested are above 0.98 in this case. The area of an n-input NAND gate is given by:

$$A_{NAND}(n) = K_{Nd} + K_{Nn} \cdot n$$

These models can be used to define the conditions of applicability for balanced and unbalanced logic decompositions.

Decomposition of AND gates

Two classes of decompositions may be considered. The first is an m-way unbalanced decomposition used when arrival times at the gate of input signals are substantially different. The second is a balanced decomposition that is applied when the arrival times are similar.

Unbalanced decomposition of AND gates

An m-way unbalanced AND decomposition is shown in FIG. 1. An AND gate G is shown as having a multiplicity of inputs: these are denoted by $t_i$ where i is from 1 to n inclusive. The $t_i$ represent the arrival times of the input signals. The gate has an input capacitance $C_{in}$ and a load capacitance $C_L$. The $t_i$ may be sorted in order of increasing arrival times ($t_{i+1} > t_i$). The objective here is to define an equation for the time gain resulting from the decomposition.

Using equation (1), the initial and final arrival times $t_{ai}$ and $t_{af}$ are given by:

$$t_{ai} = t_n + D_a(n, C_L) = t_n + (K_d + K_n \cdot n + K_c C_L)$$

$$t_{af} = D_a(n - m + 1, C_L) + max[t_m', t_n], \text{ where:}$$
$$t_m' = t_m + D_a(m, C_{in})$$

$$C_{in} = C_i + 2 \cdot C_c + C_w$$

$C_i$ = input capacitance of AND gate (similar for all AND gates)

$C_c$ = default value of contact capacitance $C_w$ = default value of wire capacitance The problem is to determine the optimal decomposition of the gate G into the gates G1 and G2. Two cases may be distinguished:

CASE 1

The first is when $t_m' < t_n$, in which case the arrival time $t_{af}$ depends only on $t_n$ and the delay through the last gate:

$$t_{af} = t_n + D_a(n - m + 1, C_L)$$

After simplification, this yields:

$$\delta t_{(1)} = t_{ai} - t_{af} = K_n \cdot (m - 1)$$

Figure 2:
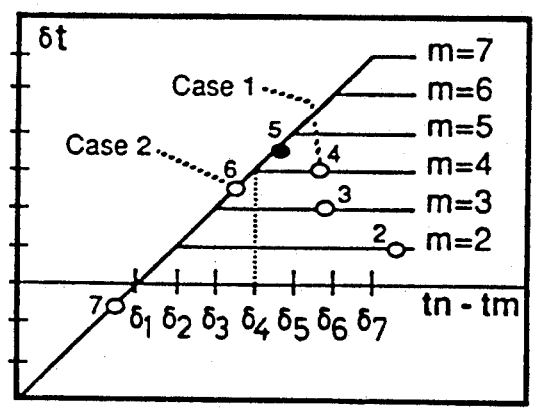
FIG. 2 is a graph illustrating the time gain available from performance of an unbalanced AND decomposition.

In other words, the time gain depends only on m. Reference may now be made to FIG. 2, wherein the horizontal lines represent the $\delta t_{(1)}$ equation for different values of m. In the same FIG. 2 are shown the transition points $\delta_m$ ie. the values of $(t_n - t_m)$ for which $t_m' = t_n$. These can be calculated using:

$$\delta_m = D_a(m, C_{in}),$$
$$= (K_d + K_n \cdot m + K_c \cdot C_{in}),$$

which is a linear function of m.

CASE 2

The second case applies when $t_m' > t_n$ and yields the following time gain:

$$\delta t_{(2)} = (t_n - t_m) - (K_d + K_n + K_c \cdot C_{in})$$
$$= (t_n - t_m) - D_a(1, C_{in})$$
$$= (t_n - t_m) - \delta_1$$

In this case, the time gain is independent of m and is proportional to $(t_n - t_m)$. The $\delta t_{(2)}$ equation is represented by the oblique line in FIG. 2. The value $\delta_1$ determines the minimum value of $(t_n - t_m)$ required to obtain a timing gain. If the maximum value of $(t_n - t_m)$ is inferior to $\delta_1$, then a balanced decomposition may be attempted. This is particularly interesting for NAND gates as described later.

The area increase is given by:

$$\delta A_{AND} = A_{ANDf} - A_{ANDi} = K_{Ad} + K_{An}$$

Note that a two-way decomposition yields the same area increase.

The algorithm for an unbalanced AND decomposition may therefore be as follows:
AND Decomp (G,n):
For m=2 to (n−1) DO:
If $(t_n - t_m) > \delta_{m-1}$
and $(t_n - t_{m+1}) < \delta_m$
Then
Split (G,n) into (G1, n-m+1) and (G2,m);
End;
If output of G2 is critical Then
AND Decomp (G2,m);
AND Decomp (G1,n+m+1);
End.

The circles in FIG. 2 represent sample experimental points for an 8 input AND gate. The six circles (taken from right to left) correspond to the values of $(t_8 - t_m)$ for m=2 to 7.

Simple inspection of the graph yields the condition for optimal timing gain, as described in the algorithm of FIG. 2. For the example above, the condition is fulfilled for m=5 since:

$(t_8 - t_5) > \delta_4$ and $(t_8 - t_6) < \delta_5$

The algorithm is two-way recursive since both of the gates may be decomposed.

FIG. 3 illustrates a multi-stage decomposition of a six-input AND gate employing the decomposition just described together with a known two-way decomposition for comparison.

Figure 3A:
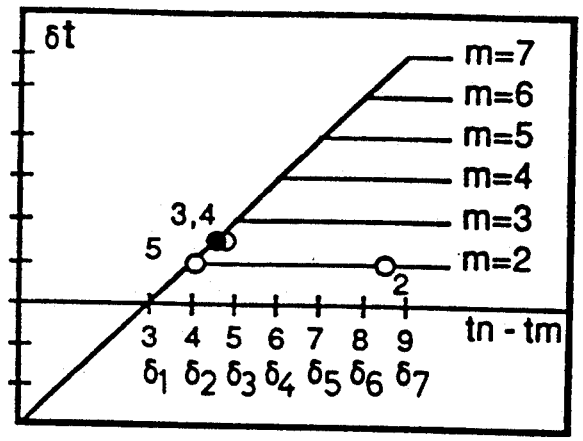
FIG. 3A is a graph illustrating the time gain available from the performance of an unbalanced AND decomposition.

A gain function, similar to FIG. 2, is shown in FIG. 3A for the six-input AND gate G (FIG. 3B) and shows the various arrival times and parameters as defined in the foregoing. The original gate G has: $D_a = 11nS$ and a total delay of 23.5 nS.

Figure 3B:
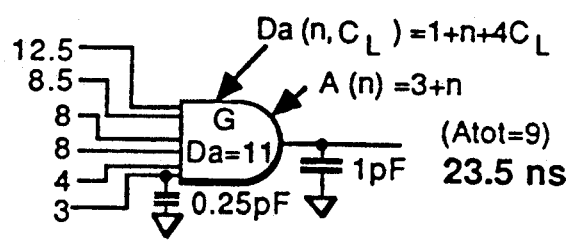
FIG. 3B and FIG. 3C show various stages of an unbalanced AND decomposition.
Figure 3C:
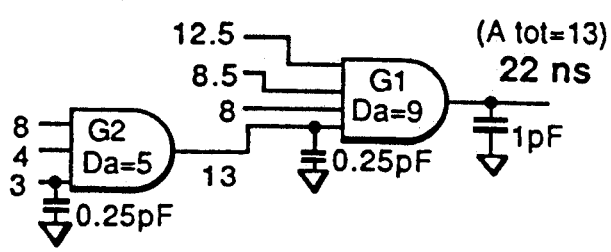

FIG. 3B illustrates the first decomposition into gates G1 and G2. For the original gate 9, the arrival times of the inputs are expressed as 3, 4, 5, 8, 8.5 and 12.5nS respectively. The first decomposition assigns the first three inputs to gate G2, which has a $D_a$ equal to 5, and the second three inputs to G1, which has a $D_a$ equal to 9. The total delay is now 22nS and the total area of the gate system has increased from 9 units to 13 units. A second decomposition decomposes gate G2 into gates G21 and G22 and a third and final decomposition decomposes gate G1 into gates G11 and G12. The result of the final decomposition is in FIG. 3C.

Figure 4:
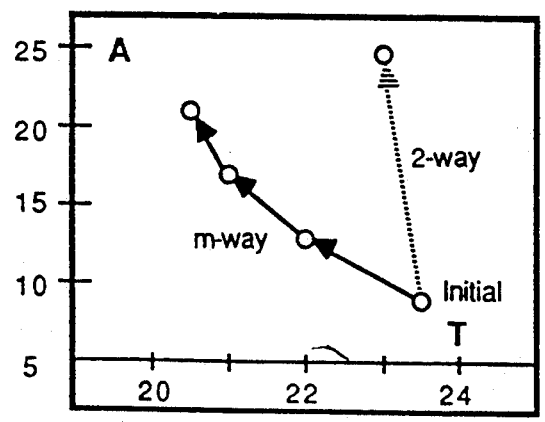
FIG. 4 illustrates a trade-off between time and area both for a prior art two-way decomposition and a decomposition according to the present invention.
Figure 3D:
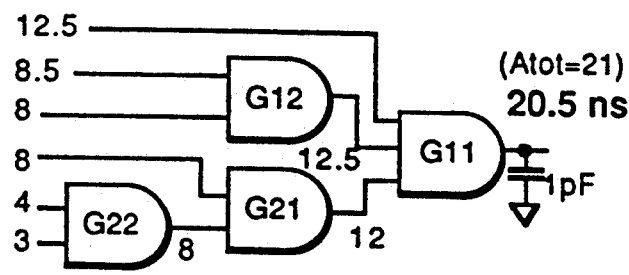
FIG. 3D shows for comparison the result of a prior art two-way decomposition.
Figure 3D:
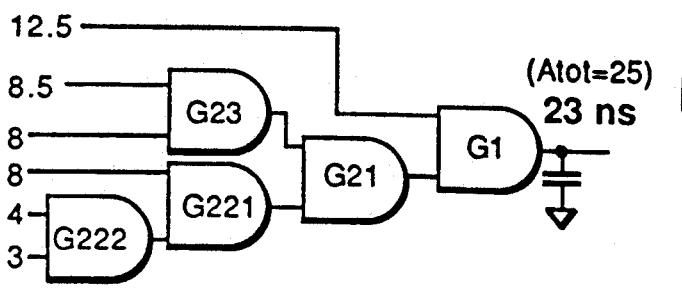

In FIG. 3D is shown a 2-way decomposition of the gate G in FIG. 3B using the TECHMAP algorithm described by Hachtel et al., "TECHMAP: Technology Mapping with Delay and Area Optimization", Proceedings of the Intl. Workshop on Logic and Architecture Synthesis for Silicon Compilers, Grenoble, May 1988. Using this algorithm, four decompositions are required. Even though this is an optimal decomposition, both the delay and area are significantly larger than for the m-way decomposition. The optimal two-way decomposition of the prior art requires five gates and a total area of 25 units, and provides total delay of 23nS. The m-way decomposition of the present invention requires four gates, an area of 21 units and provides a total delay of 20.5nS. Thus with the present invention there is both a significant reduction in the total delay for a lesser increase in area. This is shown graphically in FIG. 4, wherein the parameters of gate G are shown by the circle marked "Initial", the prior art decomposition is shown by the dotted line and the present invention is shown by the segmented solid line. This result illustrates an important aspect of gate decompositions. Since each decomposition implies an area increase (of four grids in this case), it is important to minimize the total number applied. This is particularly important because additional routing area will also be required. In the new algorithm, since m is maximized at each iteration, the number of required decompositions (three in the example) is also minimized since gates are created with the largest possible number of inputs consistent with the maximum timing gain. This is not the case for a 2-way decomposition algorithm.

Balanced AND decompositions

Equations for a balanced AND decomposition may also formulated. After simplification, the time gain is given by:

$$t = t_{ai} - t_{af} = K_n \cdot (n/2 - 2) - K_d - K_c C$$

and the condition for $\delta t > 0$ is:

$$n > 2(K_d + K_c C_{in})/K_n + 4$$

In practice this condition yields extremely high values of n (typically above 15), so that balanced AND decomposition is rarely useful. As we shall see later, this is not the case for NAND decompositions.

NAND decompositions

Using equation (2) and an approach similar to the one described above, one may obtain conditions for time gains of NAND gate decompositions.

Unbalanced NAND decompositions

Figure 5:
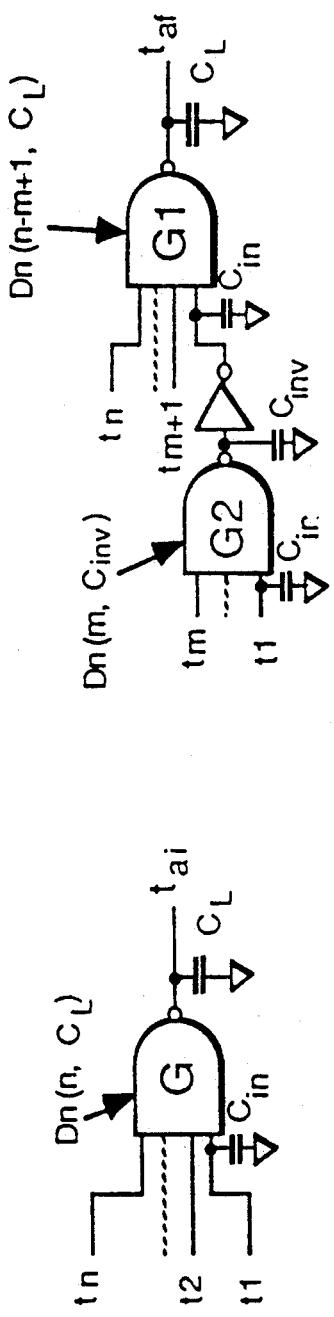
FIG. 5 illustrates an unbalanced NAND decomposition.

An m-way unbalanced NAND decomposition is given in FIG. 5. Depending on the technology one may use either a single AND gate or a NAND-inverter pair to realize the decomposed gate (G2). Here, the latter case is considered since it is applicable for many systems which use a NAND-NAND representation.

The area increase is given by:

$$\delta A_{NAND} = A_{NANDf} - A_{NANDi} = K_{Nd} + K_{Nn} + A_{inv}$$

As in the case of the AND decomposition, there are two cases to consider for time gain calculations. The first is when $t_m' < t_n$:

$$t_{af} = t_n + D_n(n-m+1, C_L),$$

this yields:

$$\delta t_{(1)} = (K_n + K_{nc} C_L) \cdot (m-1)$$

The second case ($t_m' > t_n$), yields the following time gain:

$$\delta t_{(2)} = (t_n - t_m) - K_3 - K_4 C_L + K_{nc}(C_L - C_{inv}) \cdot m$$

where $K_3$ and $K_4$ are constants that are a function of $K_d$, $K_n$, $K_c$, $C_{inv}$ and $D_{inv}(C_{in})$. These results are depicted graphically in FIG. 6 for a set value of $C_L$ (where $C_L > C_{inv}$). The curves are similar to the ones obtained for the AND decomposition except that the load capacitance causes a shift of the curves in the linear section. The shift increases with $(C_L - C_{inv})$. Since $C_{inv}$ is approximately equal to the lowest possible capacitance, the case where $C_l < C_{inv}$ need not be considered. The breakpoints are independent of $C_L$ and can be obtained with the following equation:

$$\delta_m = D_{inv}(C_{in}) + D_n(m, C_{inv})$$

which depends only on m. This implies that one can also use the same type of algorithm as for AND gates. Here the condition for maximum gain is simply the maximum value of m such that:

$$(t_n - t_m) > \delta_{m-1} - K_{nc}(C_L - C_{inv})$$

The resulting algorithm is as follows:
NAND Decomp (G,n)
For m=2 to (n−1) do:
If $(t_n - t_m) > \delta_{m-1} - k\delta C$
And $(t_n - t_{m+1}) > \delta_m - k\delta C$
Then split (G,n) into (G1, n−m+1) and (G2,m)
End;
If the output of G2 is critical, then
NAND Decomp (G2,m);
NAND Decomp (G1,n−m+1)
End.

Figure 7:
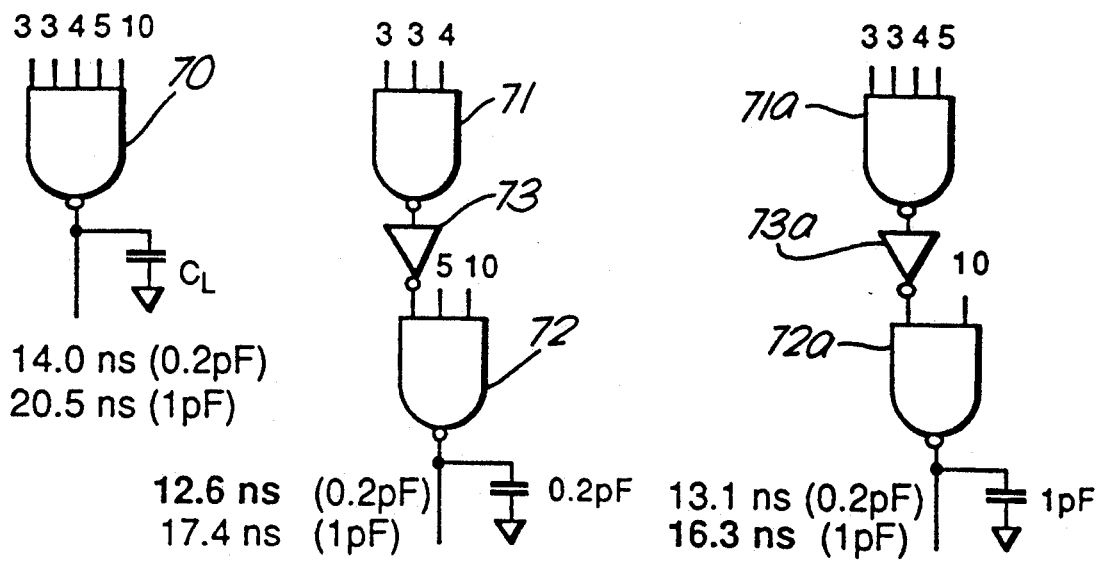
FIG. 7 illustrates unbalanced NAND decompositions.

FIG. 7 illustrates a five input NAND gate 70 which has $t_i$ with the values 3, 3, 4, 5 and 10 as shown. Two delays are shown (14nS and 20.5nS) for two values (0.2pF and 1pF) of the load capacitance. The gate may be decomposed into two different decompositions. A first comprises an NAND gate 71 receiving the first three inputs (3, 3, 4) and feeding NAND gate 72 via inverter 73. The second comprises NAND gate 71a receiving the first four inputs and feeding NAND gate 72a via inverter 73a. Two values of the delay are obtained in each case, depending on the load capacitance.

Balanced NAND decompositions

Figure 8:
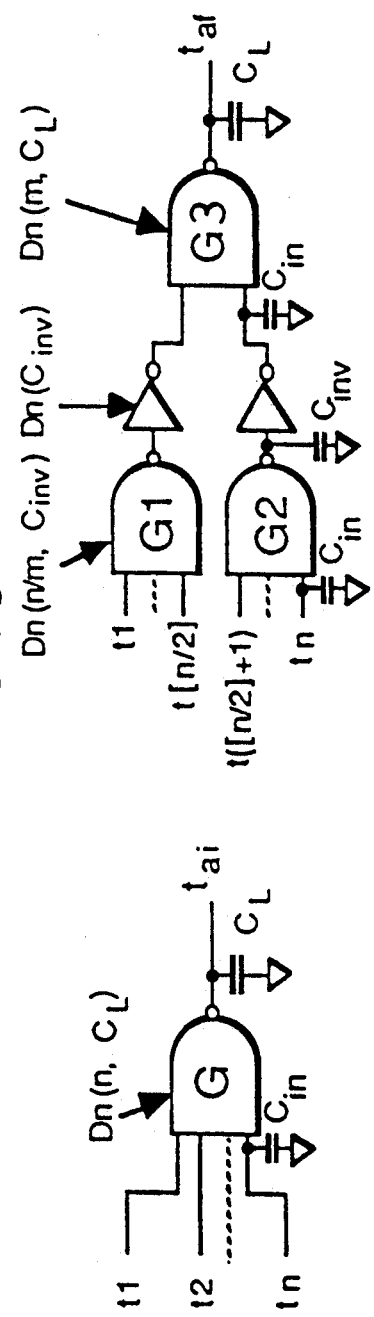
FIG. 8 illustrates a balanced NAND decomposition.

A 2-way balanced decomposition of a NAND gate G is depicted in FIG. 8. In this case gates G1 and G2 receive the first half and the second half of the input signals and each feed the final NAND gate G3 via a respective inverter.

The area increase in this case is twice that of an unbalanced decomposition and is given by:

$$\delta A_{NANDb} = 2(K_{Nd} + K_{Nn} + A_{inv})$$

From equation (2), we obtain the following arrival times:

$$t_{ai} = t_n + D_n(n, C_L)$$

$$t_{af} = t_n + D_n(n/2, C_{inv}) + D_{inv}(C_{in}) + D_n(2, C_L)$$

where, $C_{inv}$ = input capacitance of the inverter added to the default connector and wire capacitances $C_{in}$ = input capacitance of the successor NAND gate added to the default connector and wire capacitances $D_{inv}(C_{in})$ = delay through the inverter, for a load of $C_{in}$. This value is a library gate element delay model This yields the following time gain:

$$\delta t = -K_1 + K_2 \cdot n + K_{nc} \cdot (n-2) \cdot C_L, \text{ i.e.,}$$

$$\delta t > 0 \text{ when: } C_L > (K_1 - K_2 \cdot n) / (n-2) \cdot K_{nc}$$

$K_1$ and $K_2$ are constants that are a function of $K_d$, $K_n$, $K_c$, $K_{nc}$, $C_{inv}$ and of $D_{inv}(C_{in})$. Therefore, for a given value of n, we can define a fixed load capacitance threshold such that a decomposition is favourable, i.e. $\delta t > 0$. This lead us to a refined decomposition algorithm that consists of two steps:

1. Perform all unbalanced decompositions using the 'NAND Decomp' algorithm previously mentioned.
2. For all remaining gates where capacitance is above the threshold, perform a balanced decomposition.

For systems that use an area-time grading system to order the decompositions, e.g. Jit Sing et al., the evaluation of the rate of increase of area with respect to time gain, using the equations given earlier, will usually cause unbalanced decompositions to occur before balanced ones.

Piecewise linear models

For cell libraries that do not obey the simple linear models described above, or when more precise evaluations are required, piecewise linear models can be substituted so that each gate is represented by a separate linear equation. The delay for an n-input gate is now given by:

$$D_g(n, C_L) = K_d^n + K_c^n \cdot C_L$$

where:

$K_d^n, K_c^n$ = technology specific constants for the n input gate

Figure 6:
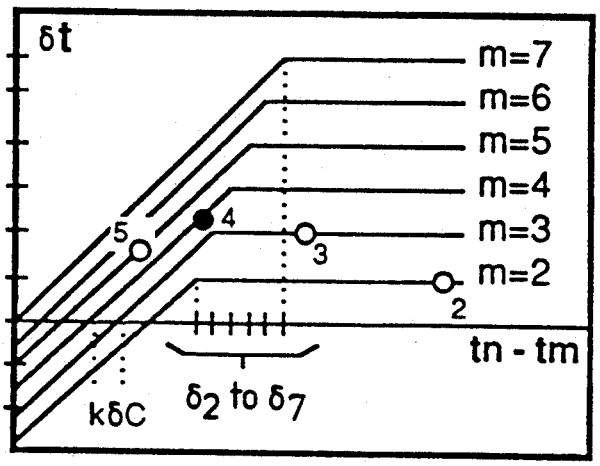
FIG. 6 is a graph illustrating the time gain available from an unbalanced NAND decomposition.

One may therefore substitute the curves of FIG. 2 and FIG. 6 with the ones obtained from a case by case analysis for each value of n. For example, it can be shown that an unbalanced NAND (NOR) gate decomposition, the gain δt is maximized when:

$$(t_n - t_m) > K_1 + K_2 \cdot C_L,$$

where:

$$K_1 = (K_d^{n-m+1} - K_d^{n-m+2}) + (K_d^m + K_c^m \cdot C_{inv}) + D_{inv}(C_{in})$$

$$K_2 = (K_c^{n-m+1} - K_c^{n-m+2})$$

For unbalanced AND or OR gate decompositions, the condition is the same except that the $D_{inv}(C_{in})$ term (i.e. the inverter delay) is omitted and $C_{inv}$ is replaced by $C_{in}$. Furthermore, for most cell libraries, the $K_2$ term will be equal to zero since the slew rate is usually identical for all AND gates.

In other words, the same algorithm may be used as before, except that the decomposition condition will be replaced by the one given above. This approach requires that, for each value of n, there is created a table of (n−2) values of $K_1$ and $K_2$. For a library in which the maximum number of gate inputs is eight, this involves storing only 42 values for each technology. For cases where the number of inputs is above eight (this may occur in some intermediate phase of logic optimization due to logic recomposition), then the linear model may be used to extrapolate values. The term 'linear' is used herein to include piecewise linear.

Experimental Results

Table I below shows the results obtained using a netlist optimizer in which the decomposition algorithms described here were integrated for experimental purposes. To isolate the effect of the decomposition algorithms we give the results for examples where the decompositions module was actually invoked. For each type of device identified under the "name" column, three sets of values are given:

1. The netlist description after the application of the speed optimizations described in section 3, but without unbalanced gate decompositions. Note that this netlist is already 20-30% faster than the initial minimum area netlist.
2. The same netlist after the application of 2-way decompositions (exhaustive search).
3. The final result which includes m-way decompositions using the algorithms described in sections 5 and 6.

The netlist size is given in gate equivalents (one gate is a equal to a CMOS 2 input NAND, or four transistors) while the delay is expressed in nanoseconds.

TABLE I

| Name | No Decomp Size | Delay | 2-Way Size | Delay | m-way Size | Delay |
|---|---|---|---|---|---|---|
| bw | 140.0 | 23.0 | 140.0 | 23.0 | 146.5 | 21.3 |
| duke 2 | 295.0 | 32.5 | 307.0 | 29.1 | 305.0 | 28.9 |
| f51.m | 111.5 | 21.8 | 112.0 | 21.3 | 112.0 | 21.0 |
| misex1 | 45.0 | 15.2 | 46.5 | 15.2 | 46.5 | 15.0 |
| rd53 | 36.0 | 17.4 | 42.0 | 17.4 | 43.0 | 13.8 |
| rd73 | 81.5 | 22.4 | 85.0 | 18.5 | 87.5 | 19.3 |
| sao2 | 152.0 | 28.4 | 157.5 | 25.5 | 159.0 | 24.7 |
| big2 | 125.0 | 22.0 | 125.0 | 22.0 | 127.0 | 21.4 |
| ctrl2 | 266.0 | 28.0 | 268.5 | 27.8 | 268.5 | 27.8 |
| fifowrite | 126.0 | 23.5 | 126.0 | 23.5 | 129.5 | 20.3 |
| flammd | 149.5 | 25.5 | 149.5 | 25.5 | 152.0 | 23.9 |
| icdma | 104.5 | 22.4 | 104.5 | 22.4 | 105.5 | 22.2 |
| planet | 645.0 | 35.6 | 705.0 | 31.7 | 705.5 | 31.7 |
| uar | 395.0 | 33.8 | 397.0 | 31.1 | 401.0 | 30.6 |

TABLE I-continued

| Name | No Decomp Size | Delay | 2-Way Size | Delay | m-way Size | Delay |
|---|---|---|---|---|---|---|
| TOTAL | 2672.0 | 351.5 | 2765.5 | 334.0 | 2788.5 | 321.9 |
| Ratios | | | +3.5% | −5.2% | +4.4% | −9.2% |
| &A/&Tt | | | 0.67 | | 0.48 | |

From these results it is clear that unbalanced decompositions can yield significant additional speed improvements. Furthermore, the m-way decomposition algorithm yields a speed improvement that is nearly twice that of an optimal 2-way decomposition (−9.2% as compared to −5.2%), but the area increase is only slightly higher (+4.4% as compared to +3.5%). This is demonstrated in the table Finally, there are many examples where m-way decompositions led to speedups and 2-way decompositions did not.

In the foregoing are presented logic decomposition algorithms using linear models for gate delays. One of the main advantages of the linear model is that it permits simple and fast decomposition algorithms that incorporate three important features:

i) m-way balanced and unbalanced decompositions are supported. These optimizations are locally optimal within the limits of the model.

ii) The algorithms favour solutions with minimal area increase.

iii) Load capacitance is taken into account explicitly. Different loads may lead to different decompositions.

We claim:

1. In a process of fabricating, with the aid of a programmed data processor, a layout of a large scale integrated circuit including a multiplicity of gating functions, a computer implemented method of decomposing a gating function having a multiplicity n of input signals as a cascade of gating means, the computer implemented method comprising the steps of;

(i) determining physical characteristics of said gating function based on the arrival times of said signals at said gating function and at least one selected capacitance associated with said gating function;

(ii) computing an optimal timing gain decomposition of the gating function into said cascade of gating means in accordance with a linear model of the gating function in terms of n and said at least one selected capacitance; and (iii) decomposing said gating function to include a cascade of gating means based on said optimal timing gain.

2. A method according to claim 1 in which the step of computing includes computing timing gain for different values of m where 1<m<n and determining said cascade of gating means to include a gate receiving m of the input signals wherein m is associated with the greatest timing gain.

3. A method according to claim 2 wherein said capacitance is a load capacitance.

4. In a process of fabricating with the aid of a programmed data processor a layout of a large scale integrated circuit including a multiplicity of gating means, a computer implemented method of decomposing a gating function determined to have a multiplicity n of input signals, the computer implemented method comprising the steps of:

(i) establishing a representation of physical characteristics of a delay function by representing said gating function linearly in terms of n and a load capacitance $C_L$;

(ii) determining the relative times of arrival $t_i$ of the input signals to said gating function;

(iii) establishing at least one representation of the gating means as a gate assembly wherein the gating function is constituted by a first gating means having the m earliest of the input signals, wherein m is less than n, and an output and a second gating means receiving said output and coupled to the remaining input signals;

(iv) computing an optimal value for m in accordance with said representation of said delay function; and (v) decomposing the gating function of include a cascade of gating means based on said optimal value during fabrication of said integrated circuit layout.

5. A method according to claim 4 in which the step of computing comprises computing, for $m=2$ to $m=(n-1)$, a timing gain and automatically selecting the value for m for which said timing gain is the greatest.

6. A method according to claim 5 in which the said representation of the gating means defines an unbalanced decomposition of the gating function wherein said first gating means receives said m inputs and the said second gating means receives the remaining inputs together with the output from the first gating means.

7. A method according to claim 4 in which the said gating function is an AND gating function, the first gating means is an AND gate and the second gating means is an AND gate.

8. A method according to claim 4 in which the said gating function is a NAND gating function, said first gating means constitutes a NAND gate followed by an inverter and the second gating means is constituted by a NAND gate.

9. A method according to claim 4 in which the said gating function is a NAND gating function, said first gating means is constituted by an AND gate and the second gating means is constituted by a NAND gate.

10. A method according to claim 4 in which the gating function is an OR function and the first and second gating means are each constituted by OR gates.

11. A method according to claim 4 in which the gating function is a NOR function, said first gating means constitutes an OR gate and the second gating means constituted a NOR gate.

12. In a process of fabricating with the aid of a programmed data processor a layout of a large scale integrated circuit including a multiplicity of gating means, a computer implemented method of decomposing a gating function determined to have a multiplicity n of input signals, the computer implemented method comprising the steps of:

(i) establishing a representation of physical characteristics of a delay function by representing the gating function linearly in terms of n and a load capacitance $C_L$;

(ii) determining relative times of arrival $t_i$ of the input signals to said gating function so as to sort the input signals in order of increasing arrival times;

(iii) establishing at least one representation of the gating function as a gate assembly wherein the gating function is constituted by a first AND gate having the m earliest input wherein m is less than n and an output and a second AND gate receiving said output and the remaining (n−m) input signals;

(iv) computing time gain functions determined by said delay function for values of m greater than unity;

(v) determining automatically the optimal value for m; and (vi) determining the layout of said gate assembly by decomposing the gating function based on said optimal value.

13. In a process of realizing with the aid of a programmed data processor a layout of a large scale integrated circuit including a multiplicity of gating means, a computer implemented method of decomposing a gating function determined to have a multiplicity n of input signals, said computer implemented method of realizing comprising the steps of:

(i) providing a delay function representing physical characteristics of the gating function linearly in terms of n and a load capacitance $C_L$;

(ii) determining relative times of arrival $t_i$ of the input signals to said gating functions;

(iii) establishing at least one representation of the gating means as a gate assembly wherein the gating function is constituted by at least a first NAND gate having m inputs wherein m is greater than 2 and less than n and an output, and a second NAND gate receiving said output by way of an inverter and coupled to respond to the remainder of the said input signals;

(iv) computing an optimal value for m in accordance with said representation of said delay function; and (v) fabricating said integrated circuit layout by decomposing the gating function using said optimal value of m.

14. A method according to claim 13 wherein the step of establishing includes establishing a second representation of the gating means as a gate assembly wherein the gating function is constituted by a fourth gate having n/2 inputs, a fifth gate having n/2 inputs, and a sixth gate having two inputs each coupled to an output of the fourth and fifth gates by way of a respective inverter, and the step of computing includes computing time gain functions to determine whether the first or the second representation is an optimal decomposition and automatically selecting the decomposition and accordingly the prescribed layout of the gate assembly realizing the gating function.

15. In a process of fabricating with the aid of a programmed data processor a layout of a large scale integrated circuit including a multiplicity of gating means, a computer implemented method of decomposing a gating function determined to have a multiplicity n of input signals the computer implemented method comprising the steps of:

(i) determining the arrival times $t_i$ of the said input signals of the said gating function wherein i has the values 1 to n inclusive; and (ii) decomposing said gating function into a first gating means and a second gating means wherein said first gating means is disposed to receive the first m of the input signals and the second gating means is disposed to receive an output of the first gating means and the remaining ones of the input signals, said decomposing step comprising:

(a) computing for each m from $m=2$ to $m=(n-1)$ whether $t_n-t_m$ has a positive excess over a time gain which is a linear function of m; and (b) selecting m for which the said magnitude is the greatest.

16. A computer implemented process of realizing a large scale integrated circuit including a multiplicity of gating functions each of which has a multiplicity of inputs and an output, comprising the computer implemented steps of:

determining for each of said multiplicity of gates relative times of arrival of respective input signals; and decomposing an original AND gating function having n input signals into at least a first and a second gate, said step of decomposing further including the steps of:

determining a first difference value $(t_n - t_m)$ and a second difference value $(t_n - t_{m+1})$ for values of m from 2 to $(n-1)$;

comparing said first difference value with a first predetermined delay and comparing said second difference value with a second predetermined delay;

splitting said original AND gating function into a first gating function having m input signals and a second gating function having $(n-m+1)$ input signals when said first difference value exceeds said first delay and said second delay exceeds said second difference value, wherein said first gating function is said first gate having a plurality m of inputs corresponding to the m earliest arrival time sand said second gating function is said second gate configured to receive the output of said first gate and the inputs (n-m+1) to n; and wherein said first and second predetermined delays are determined as functions of:

$$D_a(m, C_m) = (K_d + K_n \cdot m + K_c C_m),$$

wherein the K are constants, $D_a$ is signal rise or fall time and $C_m$ is an input capacitance.

17. A computer implemented method of compiling a large scale integrated circuit layout including a multiplicity of gating functions each of which has a multiplicity of inputs and an output, comprising the computer implemented steps of:

determining for each of said multiplicity of gates relative times of arrival of the respective input signals; and decomposing an original NAND gating function having n input signals into at least a first and a second gate, said step of decomposing further including the steps of:

determining a first difference value $(t_n - t_m)$ and a second difference value $(t_n - t_{m+1})$ for values of m from 2 to $(n-1)$;

comparing said first difference value with a first predetermined delay and comparing said second difference value with a second predetermined delay;

splitting said original AND gating function into a first gating function having m input signals and a second gating function having $(n-m+1)$ input signals when said first difference value exceeds said first delay and said second delay exceeds said second difference value, wherein said first gating function is a NAND gate having a plurality m of inputs corresponding to the m earliest arrival times and said second gating function is a NAND gate configured to receive the output of said first gate by way of an inverter and the inputs $(n-m+1)$ to n; and wherein said first and second predetermined delays are determined as functions of:

$$(C_L - C_{inv})$$

and;

$$D_{inv}(C_m) + D_n(m, C_{inv})$$

wherein:
  $D_{inv}$ is the delay of the inverter;
  $C_{in}$ is an input capacitance; and
  $C_{inv}$ and $C_L$ are the capacitances of the inverter and a load respectively.

18. In a process of fabricating a large scale integrated circuit, a computer implemented method of operating a programmed data processor to decompose a gating function which has a multiplicity n of inputs which have respective arrival times at said gating function, said computer implemented method comprising the steps of:

(i) determining whether the arrival times are similar or substantially different;
  (ii) when the said times are similar performing a balanced decomposition of said gating function;
  (iii) when the said times are substantially different, performing an m-way decomposition of the gating function wherein m is selected greater than 1 and less than n to maximize timing gain; and
  (iv) decomposing said gating function in accordance with said balanced decomposition or said m-way decomposition in response to the step of determining.

19. A method according to claim 18 wherein the step of performing the unbalanced decomposition comprises computing for each m a timing gain in accordance with a linear model of the gating function in terms of n and at least one selected capacitance.

20. A method according to claim 18 wherein the selected capacitance is a load capacitance.

21. A computer implemented process of realizing by means of a programmed data processor a layout of a large scale CMOS integrated circuit from a logic function which specifies a multiplicity of gating functions, comprising the computer implemented steps of:

optimizing timing gain by performing logic decompositions of automatically selected gating functions along a critical path of the circuit, said step of optimizing further including steps of:
  (1) permitting each decomposition to be an m-way decomposition of an n input gating function wherein m may be greater than 2 and is less than n; and
  (2) decomposing said n input gating function based on physical characteristics of said input gating function, including a linear model of the said n-input gating function in terms of n, at least one selected capacitance and constants specific to a realization as a CMOS layout.

22. A process according to claim 21 wherein the at least one selected capacitance is a load capacitance.

23. A process according to claim 21 wherein the model is a piecewise linear model dependent on n.

* * * * *